United States Patent
Hahn et al.

(10) Patent No.: US 8,877,529 B2
(45) Date of Patent: Nov. 4, 2014

(54) RADIATION-EMITTING BODY AND METHOD FOR PRODUCING A RADIATION-EMITTING BODY

(75) Inventors: Berthold Hahn, Hemau (DE); Volker Härle, Laaber (DE); Reiner Windisch, Pettendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/415,627

(22) Filed: Mar. 8, 2012

(65) Prior Publication Data

US 2012/0164770 A1    Jun. 28, 2012

Related U.S. Application Data

(62) Division of application No. 11/786,887, filed on Apr. 13, 2007, now Pat. No. 8,476,643.

(30) Foreign Application Priority Data

| Apr. 13, 2006 | (DE) | 10 2006 017 556 |
| Jan. 17, 2007 | (DE) | 10 2007 002 416 |

(51) Int. Cl.

| H01L 21/00 | (2006.01) |
| H01L 33/22 | (2010.01) |
| H01L 33/46 | (2010.01) |
| H01L 33/40 | (2010.01) |
| H01L 33/00 | (2010.01) |

(52) U.S. Cl.
CPC .............. *H01L 33/22* (2013.01); *H01L 33/405* (2013.01); *H01L 33/0079* (2013.01); *H01L 33/46* (2013.01)
USPC .................. 438/29; 438/22; 257/E33.068

(58) Field of Classification Search
None
See application file for complete search history.

(56) References Cited

U.S. PATENT DOCUMENTS

| 3,739,217 A | 6/1973 | Bergh et al. |
| 7,129,528 B2 * | 10/2006 | Bader et al. ................ 257/98 |
| 7,442,966 B2 | 10/2008 | Bader et al. |
| 7,683,386 B2 | 3/2010 | Tanaka et al. |

(Continued)

FOREIGN PATENT DOCUMENTS

| DE | 102 45 628 | 4/2004 |
| DE | 10 2005 013 894 | 1/2006 |

(Continued)

OTHER PUBLICATIONS

I. Schnitzer et al., "30% quantum efficiency from surface textured, thin-film light-emitting diodes", Appl. Phys. Lett., vol. 63, No. 18, pp. 2174-2176, Oct. 18, 1993.

*Primary Examiner* — Thien F Tran
(74) *Attorney, Agent, or Firm* — Cozen O'Connor

(57) ABSTRACT

A radiation-emitting body comprising a layer sequence having an active region for generating electromagnetic radiation, a coupling-out layer for coupling out the generated radiation, said coupling-out layer being arranged on a first side of the layer sequence, a reflection layer for reflecting the generated radiation, said reflection layer being arranged on a second side opposite the first side, and an interface of the layer sequence which faces the reflection layer and which has a lateral patterning having projecting structure elements, wherein the reflection layer is connected to the layer sequence in such a way that the reflection layer has a patterning corresponding to the patterning of the interface. A method for producing a radiation-emitting body is furthermore specified.

18 Claims, 4 Drawing Sheets

(56) References Cited

U.S. PATENT DOCUMENTS

| | | | |
|---|---|---|---|
| 2004/0266086 A1* | 12/2004 | Boone et al. | ............ 438/200 |
| 2005/0023549 A1 | 2/2005 | Gardner et al. | |
| 2005/0104080 A1 | 5/2005 | Ichihara et al. | |
| 2005/0151145 A1 | 7/2005 | Lin et al. | |
| 2005/0230699 A1 | 10/2005 | Wu et al. | |
| 2005/0269575 A1 | 12/2005 | Peng et al. | |
| 2006/0011923 A1 | 1/2006 | Eisert et al. | |
| 2007/1009611 | 5/2007 | Yasuda et al. | |

FOREIGN PATENT DOCUMENTS

| | | |
|---|---|---|
| EP | 0 977 280 | 2/2000 |
| EP | 1 471 583 | 10/2004 |
| WO | WO 2007085218 | 8/2007 |

\* cited by examiner

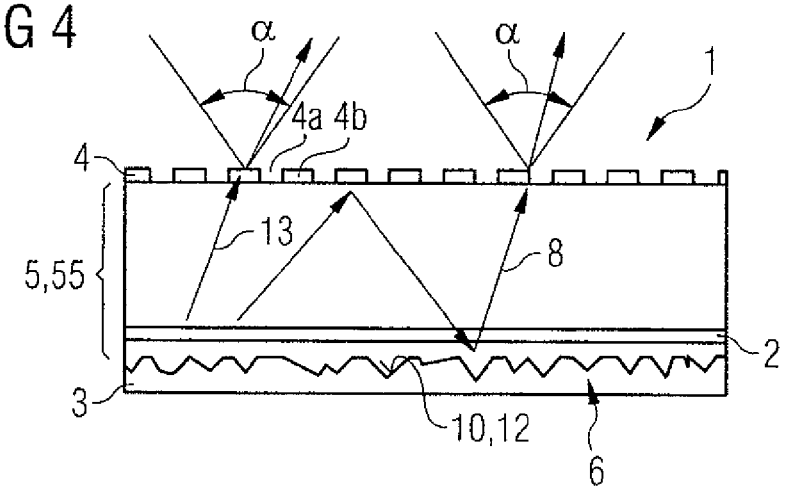
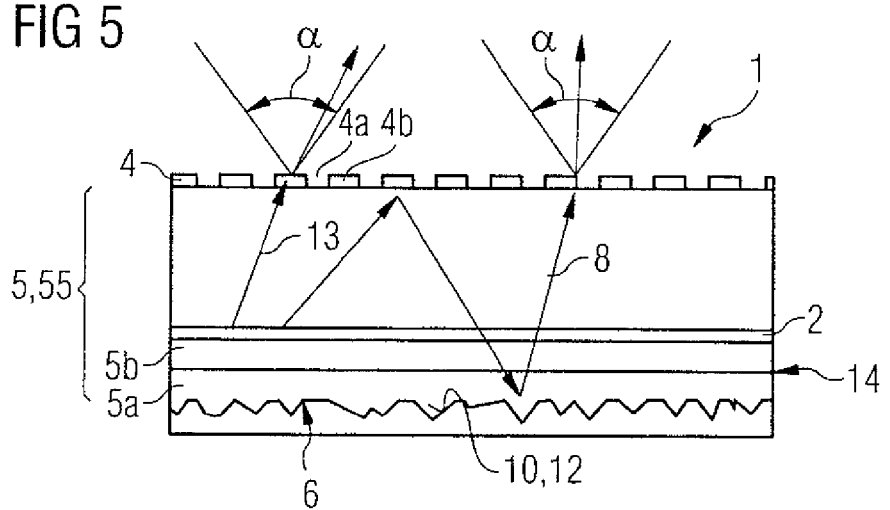
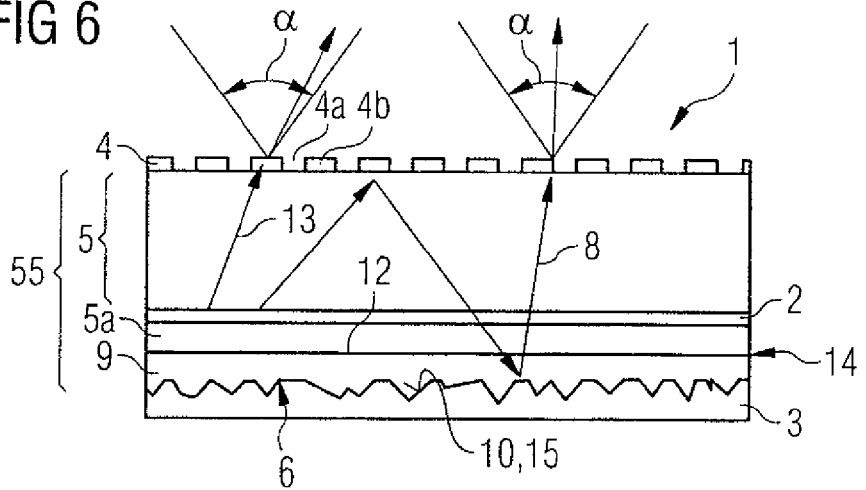

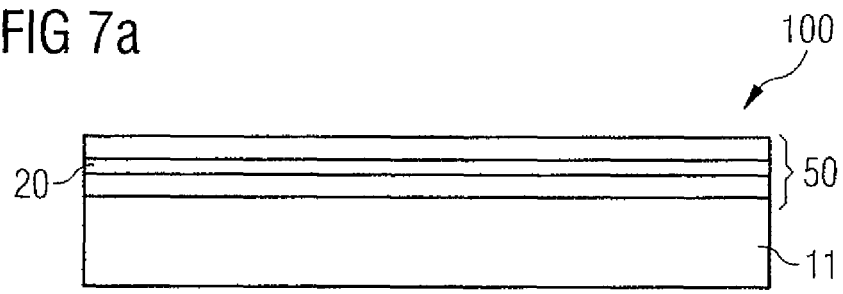
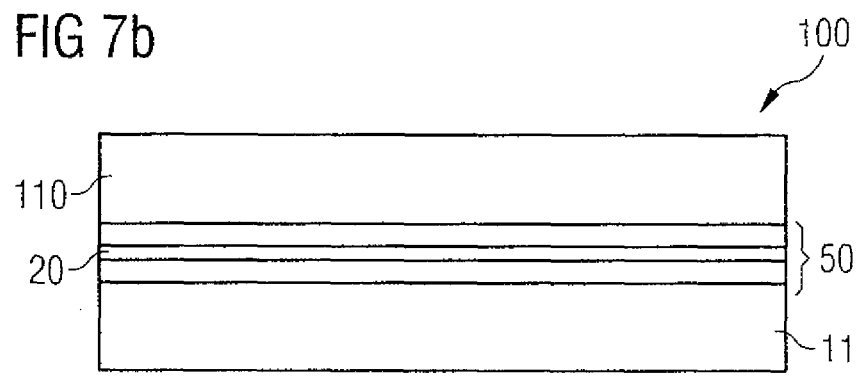
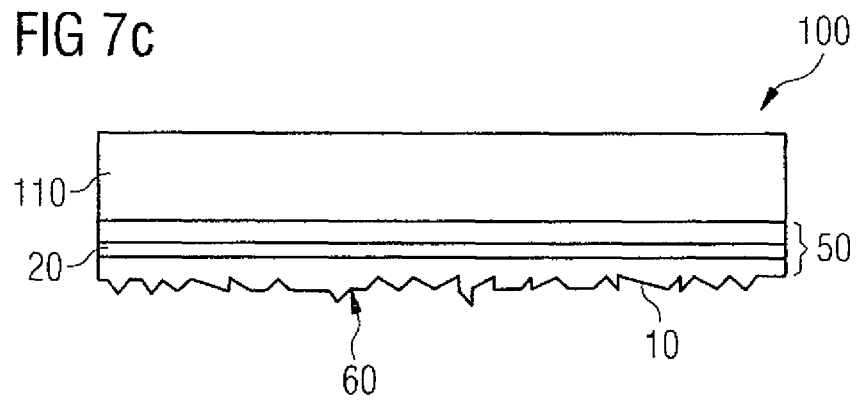

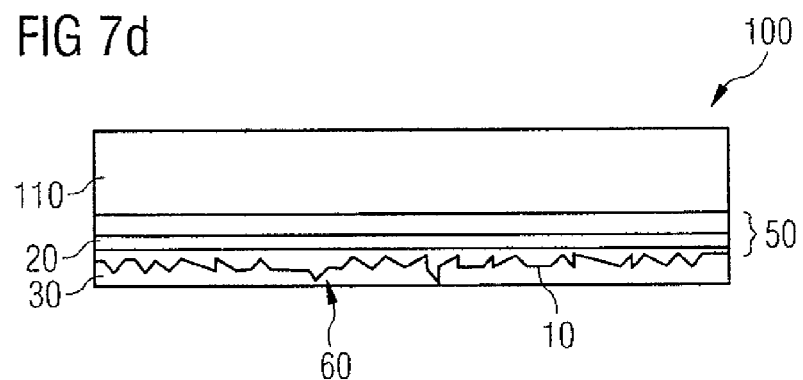
FIG 7d
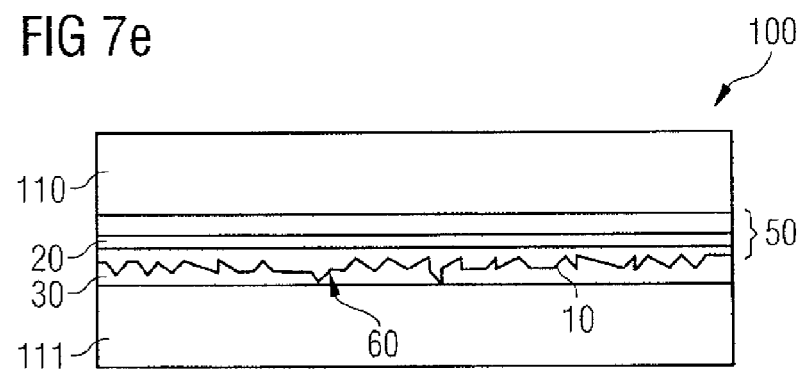
FIG 7e
FIG 7f
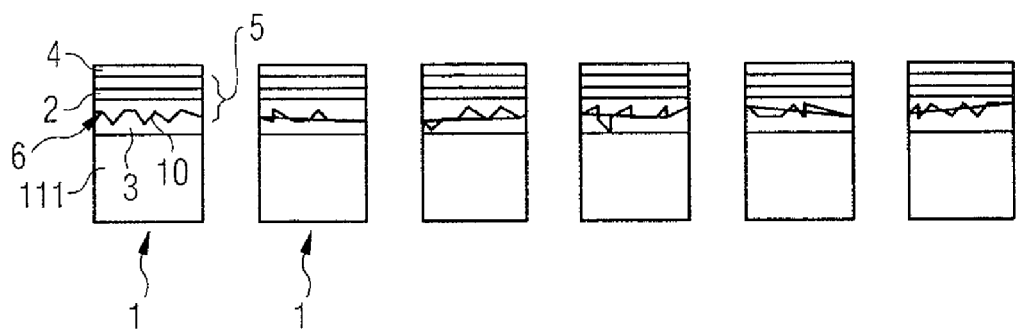

RADIATION-EMITTING BODY AND METHOD FOR PRODUCING A RADIATION-EMITTING BODY

RELATED APPLICATIONS

This application is a divisional of U.S. patent application Ser. No. 11/786,887 which was filed with the U.S. Patent and Trademark Office on Apr. 13, 2007 now U.S. Pat. No. 8,476,643. The patent application claims the priority of German Patent Application nos. 10 2006 017 556.5 filed Apr. 13, 2006 and 10 2007 002 416.0 filed Jan. 17, 2007 the disclosure content both of which is hereby incorporated by reference.

FIELD OF THE INVENTION

The invention relates to a radiation-emitting body having a layer sequence having an active region for generating radiation, a coupling-out layer and a reflection layer for reflecting the generated radiation. The invention furthermore relates to a method for producing a radiation-emitting body of this type.

BACKGROUND OF THE INVENTION

In the case of a radiation-emitting body containing an optically dense material, radiation generated by the body can be subjected to total reflection at the transition to an optically dense medium and be reflected back into the body. The radiation is "trapped" in the radiation-emitting body, whereby less radiation penetrates toward the outside.

U.S. Pat. No. 3,739,217 describes a radiation-emitting component comprising a radiation-emitting body having an uneven surface for improving the coupling-out of radiation. Radiation generated by the body that is subjected to total reflection at a radiation coupling-out surface opposite the uneven surface is deflected in the direction of the uneven surface, where the radiation is reflected in such a way that it can emerge from the body through the radiation coupling-out surface. The body is applied to a supporting, reflective baseplate on the side on which the uneven surface is situated.

SUMMARY OF THE INVENTION

It is an object of the present invention to provide a radiation-emitting body having particularly efficient coupling-out of radiation.

It is another object of the present invention to provide a production method for a radiation-emitting body having particularly efficient coupling-out of radiation.

These and other objects are attained in accordance with one aspect of the present invention directed to a radiation-emitting body that comprises a layer sequence having an active region for generating electromagnetic radiation, a coupling-out layer for coupling out the generated radiation, said coupling-out layer being arranged on a first side of the layer sequence, a reflection layer for reflecting the generated radiation, said reflection layer being arranged on a second side of the layer sequence opposite the first side, and an interface of the layer sequence which faces the reflection layer and which has a lateral patterning having a plurality of projecting structure elements, wherein the reflection layer is connected to the layer sequence in such a way that the reflection layer has a patterning corresponding to the patterning of the interface.

A layer sequence having projecting structure elements at the interface can advantageously bring about an increase in the coupling-out of radiation by 25% to above 200%. The patterned interface is typically arranged on the side of the layer sequence on which the coupling-out layer is formed. However, this may have the disadvantage, for example, that potting materials arranged on the coupling-out layer adhere comparatively poorly. The arrangement, according to the invention, of the patterned interface on the side of the layer sequence opposite the coupling-out layer has the advantage, by contrast, that the coupling-out layer can be formed in planar fashion and it is thereby possible to obtain an improved adhesion of potting materials in addition to an increase in the coupling-out radiation.

Radiation which is generated in the active region and passes to the patterned interface can advantageously be deflected by the latter into an angular range that is excluded from total reflections at the coupling-out layer. The direction of the radiation can be reversed by the reflection layer having a patterning corresponding to the patterning of the interface. The radiation is preferably deflected in the direction of the coupling-out layer.

In the present case, a patterning corresponding to the interface should be understood to mean that a surface of the reflection layer which faces the layer sequence has structure elements that are the inverse of the structure elements of the interface. The structure elements can be formed in particular by applying the reflection layer to the layer sequence in a form fitting manner.

The assemblage according to the invention comprising a coupling-out layer, a layer sequence and a correspondingly patterned reflection layer connected to the patterned interface advantageously enables a local separation of two functional regions, of which one is provided for the coupling-out of radiation (coupling-out layer) and the other is provided for increasing the coupling-out radiation (reflection layer in combination with structure elements).

In accordance with one preferred embodiment, the layer sequence of the radiation-emitting body comprises a semiconductor layer sequence. The latter in turn comprises the active region with a p-n junction. By way of example, the active region may have a quantum well structure, where the quantum well structure denotes any structure in which charge carriers experience a quantization of the energy states by means of confinement. In particular, the designation quantum well structure does not comprise any indication about the dimensionality of the quantization. It therefore encompasses, inter alia, quantum wells, quantum wires and quantum dots and any combination of these structures.

The layer sequence preferably contains a phosphide-based or nitride-based compound semiconductor material. These materials are suitable for generating radiation having a wavelength principally in the blue to infrared region of the optical spectrum.

In this context, "phosphide-based compound semiconductor material" means that the material preferably comprises $Al_nGa_mIn_{1-n-m}P$, where $0 \le n \le 1$, $0 \le m \le 1$ and $n+m \le 1$. In this case, said material need not necessarily have a mathematically exact composition according to the above formula. Rather, it may have one or more dopants and also additional constituents which do not change essentially the physical properties of the material. For the sake of simplicity, however, the above formula only comprises the essential constituents of the crystal lattice (Al, Ga, In, P), even though these may be replaced in part by small amounts of further substances.

Correspondingly, the "nitride-based compound semiconductor material" means that the material comprises a nitride-III/V compound semiconductor material, preferably $Al_nGa_mIn_{1-n-m}N$, where $0 \le n \le 1$, $0 \le m \le 1$ and $n+m \le 1$. In this case, said material need not necessarily have a mathematically exact composition according to the above formula. Rather, it may have one or more dopants and also additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even though these may be replaced in part by small amounts of further substances.

The radiation-emitting body is preferably a thin-film semiconductor body that is distinguished in particular by at least one of the following characteristic features:

a reflective layer is applied or formed at a first main area—facing toward a carrier element—of a radiation-generating epitaxial layer sequence, which reflective layer reflects at least part of the electromagnetic radiation generated in the epitaxial layer sequence back into the latter; and the epitaxial layer sequence has a thickness in the region of 20 μm or less, in particular in the region of 10 μm.

A basic principle of the thin-film light-emitting diode chip is described for example in I. Schnitzer et al., Appl. Phys. Lett. 63 (16), 18 Oct. 1993, 2174-2176, the disclosure content of which is in this respect hereby incorporated by reference.

A radiation-emitting thin-film semiconductor body is to a good approximation a Lambert surface radiator and is particularly well suited to backlighting, illumination or display purposes.

The structure elements are particularly effective if they optionally have a structure size which either lies in the region of the wavelength of the radiation impinging on the structure elements or is greater than this. In this case, the structure size lies in the region of the wavelength if it is greater than or equal to half the wavelength and less than or equal to twice the wavelength. As an alternative, the structure size may be greater than the wavelength to the extent that the laws of geometrical optics are applicable. The structure size is then limited upward only by the size of the radiation-emitting body and the thickness of the patterned layer.

In the present case, the "structure size" is preferably to be understood to mean at least one of the quantities "structure width" or "structure depth". "Structure width" denotes the width of the structure element, measured in the lateral direction, and "structure depth" denotes the depth of the structure element, measured in the vertical direction.

If structure elements having different structure sizes are present at least in parts, then the structure size, both on average and maximally and minimally, lies in the region of the wavelength or is greater than the latter.

The reflection layer preferably contains a metal or is formed as a metallic layer. In an advantageous manner, it is thereby possible for the radiation-emitting body to be electrically connected by means of the reflection layer. A metal which is particularly suitable for reflection of the impinging radiation is expediently used. By way of example, in the case of a phosphorus-based compound semiconductor material, a reflection layer containing Au or Ag is particularly suitable, and in the case of a nitride-based compound semiconductor material, a reflection layer containing Ag or Al is particularly suitable.

The reflection layer is preferably applied directly to the layer sequence. Consequently, the reflection layer is not self-supporting. By way of example, the reflection layer may be vapor-deposited or sputtered onto the layer sequence. This enables the reflection layer to be strongly connected to the layer sequence. Particularly preferably, the reflection layer is connected to the layer sequence in a form fitting manner.

In accordance with one preferred variant, the layer sequence has an interlayer arranged between the semiconductor layer sequence and the reflection layer.

The interlayer is preferably transmissive to the radiation generated by the active region. Consequently, the radiation impinging on the interlayer can pass through the interlayer and be reflected at the reflection layer.

Furthermore, the interlayer may optionally be formed such that it is electrically nonconductive or electrically conductive. In this case, a dielectric material, in particular SiN or $SiO_2$, is particularly suitable for an electrically nonconductive interlayer, and an oxide, in particular ITO (indium tin oxide) or ZnO is particularly suitable for an electrically conductive interlayer. In an advantageous manner, in the case of an electrically conductive interlayer, the reflection layer may serve as rear-side electrical contact of the radiation-emitting body.

In accordance with a first variant, a surface of the semiconductor layer sequence which adjoins the interlayer is formed in planar fashion.

In this case, the interface of the layer sequence has a lateral patterning having a plurality of projecting structure elements in particular by virtue of the fact that a surface of the interlayer which adjoins the reflection layer is patterned.

In particular, the interface of the layer sequence is roughened. In this case, the structure elements may have different structure sizes at least in parts. Furthermore, the structure elements may be distributed irregularly on the interface. In the case of a layer sequence which does not have an interlayer, the surface of the semiconductor layer sequence is roughened in this case, otherwise the surface of the interlayer is roughened.

Furthermore, in order to obtain a lateral patterning having a plurality of projecting structure elements on the interface, a surface of the semiconductor layer sequence which adjoins the interlayer may have a plurality of structure elements. Since the interlayer is preferably applied on the surface of the semiconductor layer sequence, the surface in consequence imparts its form to the interlayer.

In accordance with a further embodiment of the radiation-emitting body, a tunnel junction is arranged between the active region and the reflection layer.

In accordance with a first variant, a tunnel junction may be integrated in the semiconductor layer sequence and preferably comprise two, preferably highly doped, tunnel layers of different conduction types. Particularly preferably, one of the tunnel layers directly adjoins the reflection layer.

In accordance with a second variant, the tunnel junction is formed between the interlayer as a first tunnel layer and a layer of the semiconductor layer sequence that adjoins the interlayer as a second tunnel layer.

By means of the tunnel junction, it is possible to electrically supply the radiation-emitting body with an advantageously low resistance. In contrast to a semiconductor body having a plurality of active regions in which a tunnel junction is arranged between two active regions, in the present case the tunnel junction serves for electrically conductively connecting the reflection layer to the active region and not for electrically coupling different active regions to one another.

In accordance with one preferred embodiment, a window layer that is transmissive to the generated radiation is arranged on the coupling-out layer. Preferably, the window layer is electrically conductive and contains, in particular, a material such as ITO or ZnO. Said layer may then serve as front-side electrical contact of the radiation-emitting body. Particularly preferably, the window layer is formed in planar fashion on a side remote from the coupling-out layer.

A window layer containing a material whose refractive index is less than that of the material of the coupling-out layer or the layer sequence and greater than that of an adjoining medium, for example air, is particularly suitable. It is thereby possible to reduce the occurrence of total reflections and, consequently, to increase the coupling-out of radiation.

The coupling-out layer preferably forms a part of the semiconductor layer sequence. A patterning of the coupling-out layer may advantageously be formed by means of suitable processing of the layer sequence.

In accordance with a further preferred embodiment, the coupling-out layer likewise has a lateral patterning.

In accordance with a first variant, the coupling-out layer is roughened. The patterning may be performed like the formation of the structure elements.

In accordance with a second variant, the coupling-out layer is a photonic crystal. In an advantageous manner, the original emission angle of the radiation generated by the radiation-emitting body can be constricted by means of the photonic crystal and a directional effect can thereby be obtained.

The photonic crystal preferably comprises a plurality of first regions having a first refractive index and a plurality of second regions having a second refractive index. Particularly preferably, the regions are arranged regularly. The regular arrangement may correspond to a one-dimensional, two-dimensional or three-dimensional lattice. In particular, the photonic crystal in the context of the invention may have the structure of a two-dimensional lattice. In this case, the distance between two adjacent first regions or two adjacent second regions corresponds to the lattice constant. The photonic crystal obtains its effect best if the lattice constant is adapted to a wavelength of the radiation generated by the radiation-emitting body. Preferably, the distance between two adjacent first regions or two adjacent second regions approximately corresponds to the wavelength of the radiation generated by the radiation-emitting body. The distance is particularly preferably between $10^{-9}$ m and $10^{-6}$ m.

In accordance with one preferred variant, the second regions are contiguous. That is to say that two second regions in each case have, in particular, more than one contact point, for example a contact area. In this case, the contact point or the contact area should not be understood as physical constituents, but rather emerge on the basis of an imaginary subdivision of the photonic crystal into identically constructed "crystal cells".

The photonic crystal typically contains a dielectric material. According to the invention, the first regions are particularly preferably filled or unfilled depressions in a semiconductor layer of the semiconductor layer sequence. The first regions can be introduced into the semiconductor layer as depressions in a periodic arrangement. As an alternative, it is possible to arrange the first regions in lattice-like fashion, the latter being formed in insular fashion and being separated from one another by suitable interspaces, for example a contiguous depression. The second possibility therefore represents the inversion of the first possibility in that the regions and the depressions are interchanged relative to one another. In both cases, the depressions or interspaces can advantageously be filled with a filling material, for example a dielectric or some other semiconductor material, whose refractive index differs from the refractive index of the first region. In particular, the first regions have a width and/or depth of between 100 nm and 500 nm.

A method for producing a radiation-emitting body is specified below. In particular, the method is suitable for producing a radiation-emitting body in accordance with the configurations mentioned above.

It should be pointed out that apart from being characterized by the features mentioned below, the method may be characterized by the features that were mentioned in connection with the radiation-emitting body, and vice versa. This may concern material specifications or size specifications, by way of example.

Another aspect of the invention is directed to a radiation-emitting body that has the steps of:

forming a layer sequence comprising an active region for generating radiation on a substrate, forming a lateral patterning having a plurality of projecting structure elements on an interface of the layer sequence, and arranging a reflection layer for reflecting the generated radiation on the interface having the structure elements, with the result that the reflection layer has a patterning corresponding to the patterning of the interface.

In accordance with one preferred configuration, the layer sequence comprises a semiconductor layer sequence. The semiconductor layer sequence may advantageously be grown epitaxially on the substrate. A material system used for the substrate particularly preferably has a lattice constant adapted to the lattice constant of the material system of the layer sequence.

The substrate is furthermore preferably stripped away in the course of the production of the body. This has the advantage, for example, that the radiation-emitting body can be produced with a small height. In this case, the layer sequence may alternatively be applied to an intermediate carrier that stabilizes the layer sequence after the substrate has been stripped away. The intermediate carrier can also be stripped away at the end, the carrier preferably being arranged in the place of the stripped-away substrate.

In accordance with a further embodiment of the method, a surface of the layer sequence or the semiconductor layer sequence is roughened. Projecting structure elements which are arranged irregularly on the interface are formed as a result.

The interface is preferably patterned by means of natural lithography.

This method may essentially be described by the fact that balls are applied on the interface of the layer sequence and adhere to the interface. By means of dry etching, pillar-type structure elements remain at the locations of the balls, the space between the structure elements being etched away from the layer sequence by the dry etching process.

In this way, it is possible to form structure elements having a structure size in the region of the wavelength of the radiation impinging on the structure elements. By way of example, the structure width may be 300 nm and the structure depth may be 200 nm.

Structure elements having a structure size that is significantly greater than the wavelength can be formed by means of wet-chemical etching or dry etching. In this case, the structure size is in the region of >4 µm.

Furthermore, known etching methods can be used for forming structure elements on the interface or for roughening the interface. Etching methods of this type are for example wet-chemical etching or dry etching, among which mention shall be made of reactive ion etching, ion beam etching or chemically assisted ion beam etching.

Photolithography is particularly suitable for forming regular interface structures.

Preferably, the reflection layer is applied directly to the interface. In particular, the reflection layer is applied in such a way that it is strongly connected to the interface, with the result that the risk of the reflection layer being stripped away is comparatively low even during later operation of the radiation-emitting body.

Suitable methods for applying the reflection layer are sputtering or vapor deposition, for example. It is also conceivable for the reflection layer to be applied galvanically.

An interlayer may be formed between the semiconductor layer sequence and the reflection layer. The interlayer may be applied to the semiconductor layer sequence in particular by sputtering or by means of CVD (Chemical Vapor Deposition).

Finally, it is possible for a further surface of the radiation-emitting body, which serves for coupling out the radiation, likewise to be provided with a lateral patterning according to one of the abovementioned methods.

BRIEF DESCRIPTION OF THE DRAWINGS

FIG. 4 shows a schematic cross-sectional view of a fourth exemplary embodiment of a radiation-emitting body according to the invention, FIG. 5 shows a schematic cross-sectional view of a fifth exemplary embodiment of a radiation-emitting body according to the invention, FIG. 6 shows a schematic cross-sectional view of a sixth exemplary embodiment of a radiation-emitting body according to the invention, FIGS. 7a to 7f show a schematic illustration of single production steps of a method according to the invention.

DETAILED DESCRIPTION OF THE DRAWINGS

Figure 1:
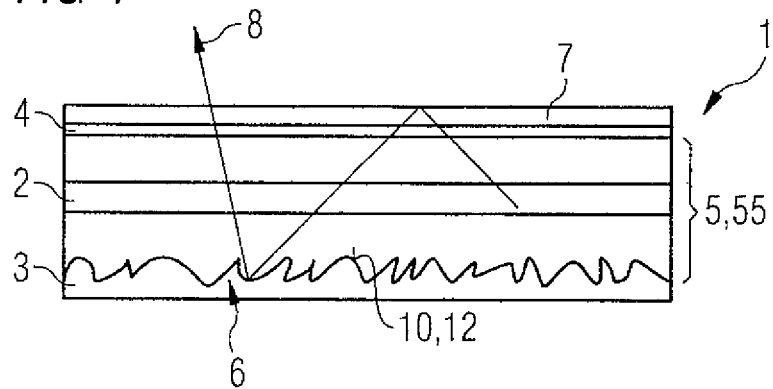
FIG. 1 shows a schematic cross-sectional view of a first exemplary embodiment of a radiation-emitting body according to the invention.

The radiation-emitting body 1 illustrated schematically in FIG. 1 has a semiconductor layer sequence 5 comprising an active region 2 for generating electromagnetic radiation. The active region 2 preferably contains a semiconductor material, in particular InGaAlP.

A coupling-out layer 4 for coupling out the generated radiation is arranged on a first side of the layer sequence 55. Said layer 4 is formed in planar fashion and therefore facilitates the application of a well-adhering further layer 7. The coupling-out layer 4 may be formed as a part of the layer sequence 5.

Avoiding unevenness on the coupling-out layer 4 can improve the tightness of layers disposed downstream, for example of passivation layers disposed downstream, which can furthermore improve the reliability and ageing resistance of the radiation-emitting body 1.

Furthermore, a high quality and purity of the coupling-out layer 4 that are present in contrast to a roughened coupling-out layer facilitate the application of a window layer 7. In particular, the window layer 7 is radiation-transmissive and electrically conductive. By way of example, the window layer 7 contains a TCO (Transparent Conductive Oxide), for example ITO or ZnO. The window layer 7 may advantageously be applied to a p-conducting layer of the radiation-emitting semiconductor body 1. This is preferably the coupling-out layer 4. By means of the large-area contact-connection on the coupling-out side by means of the electrically conductive window layer 7, it is possible to obtain a comparatively good current expansion right into the high-current range.

A reflection layer 3 for reflecting the generated radiation is arranged on a second side of radiation-emitting body 1 opposite the first side. The reflection layer 3 is a metallic layer, Au or Ag being particularly suitable in the case of a radiation-emitting body 1 having InGaAlP.

The thickness of the reflection layer 3 is chosen in such a way that the impinging radiation does not radiate through the reflection layer 3. Preferably, the thickness is in the region of 1 μm. Since the reflection layer 3 contains a metal, it is at the same time electrically conductive, whereby an electrical connection of the radiation-emitting body 1 by means of the reflection layer 3 is advantageously possible.

The interface 10 facing the reflection layer 3, said interface simultaneously being the surface 12 of the semiconductor layer sequence 5, has projecting structure elements 6. The structure size of the structure elements 6 is in the region of the wavelength of the radiation generated in the radiation-emitting body 1. It is between 200 nm and 300 nm, in particular.

Given a structure size of this type, the light deflection (see light beam 8) occurring at the structure elements is based on the scattering of the impinging light beams.

An increase in the coupling-out of light can advantageously be brought about by the scattering that occurs. Said increase is particularly desirable in the case of an InGaAlP-based semiconductor body since the latter has an active region 2 that greatly absorbs the generated radiation.

The structure elements 6 are arranged randomly on the interface 10 and have a structure size which both on average and maximally and minimally lies in the region of the wavelength of the impinging radiation.

The structure elements 6 can be formed by means of the methods already described, preferably by means of natural lithography.

The reflection layer 3 has elements that are the inverse of the structure elements 6 on a surface facing the interface 10. Said elements are formed by virtue of the reflection layer 3 being connected to the semiconductor layer sequence 5 in a form fitting manner. The reversal of the direction of the impinging radiation 8 that occurs at the reflection layer 3 may be based both on scattering and on reflection.

In an advantageous manner relative to the prior art, by means of the reflection layer 3, the structure elements 6 can be moved to the side of the layer sequence 55 opposite to the coupling-out layer 4, whereby the coupling-out layer 4 can be electrically contact-connected in an efficient manner in addition to an increase in the coupling-out radiation.

Figure 2:
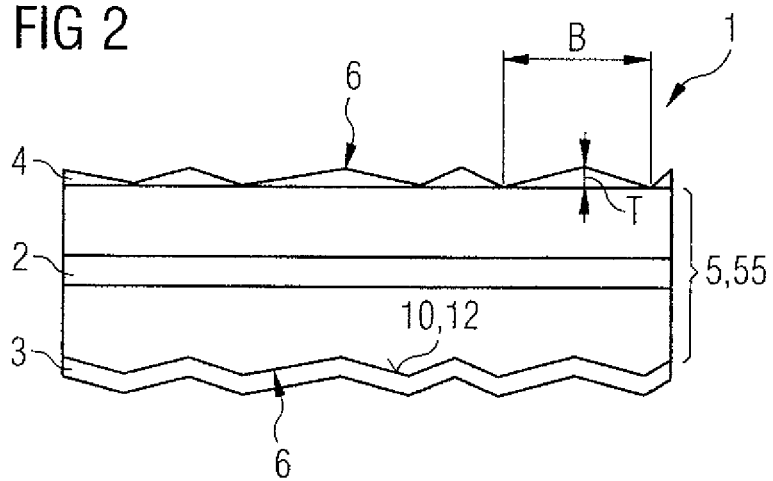
FIG. 2 shows a schematic cross-sectional view of a second exemplary embodiment of a radiation-emitting body according to the invention.

The radiation-emitting body 1 illustrated in FIG. 2 has the layer sequence 55 comprising the semiconductor layer sequence 5 with the active region 2. The semiconductor layer sequence 5 and the coupling-out layer 4 are preferably grown epitaxially, the substrate being stripped away. The radiation-emitting body 1 is particularly preferably a thin-film semiconductor body.

The semiconductor layer sequence 5 and the coupling-out layer 4 contain a nitride-based compound semiconductor material. The semiconductor layer sequence 5 contains InGaN, in particular.

In contrast to an InGaAlP-based active region as illustrated in FIG. 1 which greatly absorbs the generated radiation, the InGaN-based active region, given a corresponding thickness of the layer sequence, is essentially transmissive to the generated radiation.

Consequently, the increase in the coupling-out radiation that is brought about by means of the structure elements 6 may turn out to be smaller than in the case of the radiation-emitting body 1 illustrated in FIG. 1 and a sufficient coupling-out of radiation can nevertheless be obtained.

A smaller increase in the coupling-out of radiation occurs for example if the structure elements 6 are made larger. A layer having larger structure elements 6 has the advantage, however, that the adhesion of a layer disposed downstream is adversely affected to a lesser extent than in the case of a greatly patterned layer.

In order nevertheless to achieve a sufficient coupling-out of radiation, it is possible, as illustrated in FIG. 2, for structure elements 6 to be arranged both on the coupling-out layer 4 and on the layer sequence 5.

The structure size of the structure elements 6 is greater than the wavelength of the impinging radiation to the extent that the laws of geometrical optics are applicable. The structure size concerns the width B and depth T of the structure elements 6. By way of example, the structure size may be in the region of >4 μm.

Structure elements 6 of this type may be formed by means of one of the methods already mentioned. Preferably, the structure elements 6 have different sizes and are distributed irregularly on the interface 10, which is also a surface 12 of the semiconductor layer sequence 5. However, it is also conceivable to arrange the structure elements 6 with an identical size at regular distances.

The microstructure of the illustrated structure elements 6 which are connected to the reflection layer 3 in a form fitting manner corresponds to locally differently inclined mirror surfaces. The radiation deflection by means of specular reflection contributes to the increase in the coupling-out of radiation.

Furthermore, a window layer may be applied to the coupling-out layer 4, said window layer being transmissive to the generated radiation. The window layer preferably contains a material having a refractive index less than that of the material of the radiation-emitting body 1 and greater than that of an adjoining medium, for example air. This enables the coupling-out of radiation to be improved further.

The window layer particularly preferably contains an epoxy, epoxy resin, silicone or a mixture of said materials. Said materials additionally have a positive effect on the ageing resistance of the radiation-emitting body 1.

Figure 3:
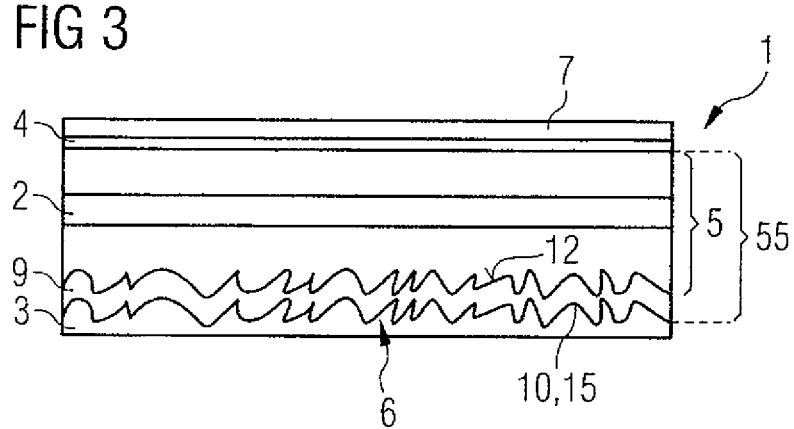
FIG. 3 shows a schematic cross-sectional view of a third exemplary embodiment of a radiation-emitting body according to the invention.

In the case of the radiation-emitting body 1 illustrated in FIG. 3, the layer sequence 55 comprises the semiconductor layer sequence 5 and an interlayer 9 arranged between the semiconductor layer sequence 5 and the reflection layer 3. Said interlayer 9 is transmissive to the impinging radiation.

The interlayer 9 makes it possible to improve the mechanical stability of the radiation-emitting body 1 and to influence the electrical conductivity.

In order to insulate the radiation-emitting body 1 on the rear side, the interlayer 9 may contain a dielectric material, for example SiN or $SiO_2$.

In order to enable a rear-side electrical contact, the interlayer 9 may contain a conductive metal oxide, for example ITO or ZnO.

The interlayer 9 is preferably applied to a patterned surface 12 of the semiconductor layer sequence 5 in a form fitting manner, for example by means of sputtering or CVD. A surface 15 of the interlayer 9 that faces the reflection layer 3 forms the interface 10. The structure elements 6 of the surface 15 or of the interface 10 arise as a result of correspondingly shaped elements on the surface 12 of the semiconductor layer sequence 5, so that the reflection layer 3 is again formed with elements that are the inverse of the structure elements.

The structure elements 6 may have a structure size in the region of the wavelength of the impinging radiation. As an alternative, the structure size may be significantly greater than the wavelength.

In a further embodiment, the interlayer 9 may be formed such that it is at least partly electrically conductive or insulating.

In the case of the radiation-emitting body 1 illustrated in FIG. 4, the coupling-out layer 4 is formed as a photonic crystal. The photonic crystal has regions 4a having a first refractive index and regions 4b having a second refractive index. The regions 4a are preferably introduced as depressions into a final layer of the layer sequence 55. The depressions may furthermore be filled with a filling material having a different refractive index from that of the semiconductor material of the final semiconductor layer.

The regions 4a are preferably formed in cylindrical fashion. However, any other form is also conceivable. The regions 4a are arranged regularly, with the result that a two-dimensional lattice is produced on account of this arrangement.

Radiation generated in the active region 2 can pass directly, as illustrated by the beam 13, into the coupling-out layer 4 and couple out from the radiation-emitting body 1 if it impinges on the coupling-out layer 4 within a non-critical angle. The radiation emerging from the radiation-emitting body 1 forms a radiation cone having an aperture angle α. The radiation may pass indirectly, as illustrated by the beam 8, for example, into the coupling-out layer 4 if it is first emitted by the active region 2 in the direction of the coupling-out layer 4 and is reflected back there, because it impinges on the coupling-out layer 4 at a critical angle, into the layer sequence 5. The radiation can then be reflected at the reflection layer 3 and be deflected on account of the patterned interface 10 in such a way that it impinges on the coupling-out layer 4 at a non-critical angle and consequently couples out from the radiation-emitting body 1.

The radiation-emitting body 1 illustrated in FIG. 5, like the radiation-emitting body 1 illustrated in FIG. 4, also has a coupling-out layer 4 formed as a photonic crystal. In contrast to the radiation-emitting body 1 illustrated in FIG. 4, the radiation-emitting body 1 illustrated in FIG. 5 preferably comprises on the p-side a tunnel junction 14 integrated into the layer sequence 55. Particularly preferably, the semiconductor layer 5a, which forms a first tunnel layer, contains a highly doped n-conducting semiconductor material, while the semiconductor layer 5b which forms the second tunnel layer, has a highly doped p-conducting semiconductor material. In this exemplary embodiment, the contact formation on the p-conducting semiconductor layer, which can turn out to be comparatively difficult, is advantageously obviated. Since the p-conducting semiconductor material has a relatively low conductivity, the contact formation on the n-conducting semiconductor layer 5a has the advantage that the threshold voltage is reduced.

The radiation-emitting body 1 illustrated in FIG. 6 has a rear-side, preferably p-side, contact comparable to the radiation-emitting body 1 illustrated in FIG. 5. This is because a tunnel junction 14 is formed in this case, too, in order to improve the electrical connection between the active region 2 and the reflection layer 3. However, the tunnel junction 14 is not integrated into the semiconductor layer sequence 5, but rather is formed between the interlayer 9 as a first tunnel layer and a semiconductor layer 5a of the semiconductor layer sequence 5 that adjoins the interlayer 9 as a second tunnel layer. The interlayer 9 contains in particular a TCO, for example ITO, and may be applied to the surface 12 after the production of the semiconductor layer sequence 5. A surface 15 of the interlayer 9 which adjoins the reflection layer 3 and which forms the interface 10 is provided with a lateral patterning having a plurality of projecting structure elements 6.

In the case of the method for producing a radiation-emitting body as illustrated in FIG. 7, firstly (FIG. 7a) a semiconductor layer sequence 50 is arranged on a substrate 11. The wafer 100 formed in this way comprises an active region 20 provided for generating radiation.

The semiconductor layer sequence 50 preferably contains a phosphide- or nitride-based compound semiconductor material in the sense of the abovementioned definition, in particular InGaAlP or InGaN. However, an arsenic-based compound material, for example GaAlAs, is also conceivable.

Semiconductor layer sequence 50 is particularly preferably grown onto the substrate 11. In this case, the substrate 11 typically contains a material system whose lattice constant is adapted to the lattice constant of the material system of the layer sequence 50. In the case of a nitride-based compound semi-conductor, a substrate containing sapphire or SiC is suitable, by way of example.

In a further production step illustrated in FIG. 7b, an intermediate carrier 110 is applied on a side of the semiconductor layer sequence 50 that is opposite to the substrate 11. The intermediate carrier 110 reinforces the semiconductor layer sequence 50 when the substrate 11 is stripped away.

As illustrated in FIG. 7c, an interface 10 of the semiconductor layer sequence 50 from which substrate 11 has been stripped away is provided with structure elements 60. The interface 10 is preferably roughened by means of one of the methods already mentioned. Particularly preferably, structure elements 60 which are arranged irregularly on the interface 10 and have different structure sizes are formed as a result. Depending on the respective material system, the structure size may either be in the region of the wavelength of the radiation that is relevant in later operation, or be significantly greater than this.

FIG. 7d illustrates the application of a reflection layer 30 to the interface 10 provided with the structure elements 60. The reflection layer 30 preferably contains a metal, which can be applied to the interface 10 by vapor deposition or sputtering, by way of example.

In a step illustrated in FIG. 7e, the wafer 100 is connected to a carrier 111. The intermediate carrier 110 can subsequently be stripped away.

Finally, the wafer 100 can be singulated into a plurality of radiation-emitting bodies 1 (FIG. 7f). The bodies 1 have the semiconductor layer sequence 5 with the active region 2, the coupling-out layer 4 and the reflection layer 3 opposite the latter, the structure elements 6 being arranged between the active region 2 and the reflection layer 3.

As an alternative, after the production step illustrated in FIG. 7a, a surface of the semiconductor layer sequence that is remote from the substrate may be provided with structure elements. Afterward, the carrier is arranged on the side provided with the structure elements and the substrate is stripped away. The wafer can then be singulated into a plurality of radiation-emitting bodies.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or the exemplary embodiments.

We claim:

1. A method for producing a radiation-emitting body, comprising:

forming a layer sequence comprising an active region for generating radiation on a substrate;

forming a first lateral patterning having a plurality of projecting structure elements on an interface of the layer sequence;

arranging a reflection layer for reflecting the generated radiation on the interface having the structure elements, wherein the reflection layer has a patterning corresponding to the first lateral patterning of the interface, and wherein a surface of the layer sequence is roughened to form the interface such that the structure elements are distributed irregularly on the interface.

2. The method as claimed in claim 1, wherein the layer sequence comprises a semiconductor layer sequence.

3. The method as claimed in claim 2, further comprising striping away the substrate.

4. The method as claimed in claim 2, wherein a surface of the semiconductor layer sequence is roughened to form the interface.

5. The method as claimed in claim 4, wherein the surface is patterned by natural lithography.

6. The method as claimed in claim 4, wherein the surface is patterned by wet-chemical etching.

7. The method as claimed in claim 4, wherein the surface is patterned by photolithography.

8. The method as claimed in claim 2, wherein an interlayer is formed between the semiconductor layer sequence and the reflection layer.

9. The method as claimed in claim 8, wherein the interlayer is applied to the semiconductor layer sequence by sputtering.

10. The method as claimed in claim 8, wherein the interlayer is applied to the semiconductor layer sequence by CVD.

11. The method as claimed in claim 1, wherein the reflection layer is applied directly to the interface.

12. The method as claimed in claim 11, wherein the reflection layer is sputtered onto the interface.

13. The method as claimed in claim 11, wherein the reflection layer is vapor-deposited onto the interface.

14. The method as claimed in claim 11, wherein the reflection layer is applied to the interface by electroplating.

15. The method as claimed in claim 1, wherein a coupling-out layer arranged on the layer sequence is provided with a second lateral patterning.

16. The method as claimed in claim 1, wherein the reflection layer contains a metal or is formed as metallic layer.

17. A method for producing a radiation-emitting body, comprising:

forming a layer sequence comprising an active region for generating radiation on a substrate;

forming a first lateral patterning having a plurality of projecting structure elements on an interface of the layer sequence;

arranging a reflection layer for reflecting the generated radiation on the interface having the structure elements, wherein the reflection layer has a patterning corresponding to the first lateral patterning of the interface, and wherein a surface of the layer sequence is roughened to form the interface such that the structure elements have different structure sizes at least in parts.

18. A method for producing a radiation-emitting body, comprising:

forming a layer sequence comprising an active region for generating radiation on a substrate;

forming a first lateral patterning having a plurality of projecting structure elements on an interface of the layer sequence;

arranging a reflection layer for reflecting the generated radiation on the interface having the structure elements, wherein the reflection layer has a patterning corresponding to the first lateral patterning of the interface, and wherein a surface of the layer sequence is patterned by natural lithography to form the interface.

* * * * *